March 30, 1965 M. M. ATALLA ETAL 3,176,151

VARACTOR DIODE WITH CONCENTRATION OF DEEP LYING IMPURITIES AND ENABLING CIRCUITRY

Filed Feb. 13, 1961 2 Sheets-Sheet 1

INVENTORS M. M. ATALLA
D. KAHNG
BY H.W. Lockhart
ATTORNEY

March 30, 1965 M. M. ATALLA ETAL 3,176,151
VARACTOR DIODE WITH CONCENTRATION OF DEEP
LYING IMPURITIES AND
ENABLING CIRCUITRY
Filed Feb. 13, 1961 2 Sheets-Sheet 2

FIG. 4

| | |
|---|---|
| CASE I | $f \ll f_i < f_r$ |
| CASE II | $f_i < f < f_r$ |
| CASE III | $f \gg f_r > f_i$ |
| | $f$ - SIGNAL<br>$f_i$ - IONIZATION<br>$f_r$ - RECOMBINATION |

United States Patent Office 3,176,151
Patented Mar. 30, 1965

3,176,151

VARACTOR DIODE WITH CONCENTRATION OF DEEP LYING IMPURITIES AND ENABLING CIRCUITRY

Martin M. Atalla, Mountainside, and Dawon Kahng, Somerville, N.J., assignors to Bell Telephone Laboratories, Incorporated, New York, N.Y., a corporation of New York Filed Feb. 13, 1961, Ser. No. 88,912
7 Claims. (Cl. 307—88.5)

This invention relates to signal translating devices.

More particularly, this invention relates to solid state varactor diodes and enabling circuitry.

A varactor diode is a PN junction semiconductor device which derives its name from its mode of operation as a variable reactance element.

The figure of merit of a varactor diode depends, to a large extent, on the change of capacitance the device exhibits for a given change in the reverse voltage applied across its junction. Although prior art varactor diodes are satisfactory in this respect, the figure of merit of such a device is improved considerably if the change in capacitance for a given change in applied voltage is increased.

Accordingly, an object of this invention is a device exhibiting a higher figure of merit than that of prior art varactor diodes.

This invention is based on the discovery that a semiconductor crystal including a PN junction and having properly disposed crystal irregularities can be made to exhibit a particularly sensitive capacitance-voltage characteristic under reverse bias conditions.

The crystal irregularities are provided alternatively by plastic deformation of the crystal, bombardment of the crystal by high energy particles or by diffusing particular impurities into the crystal to provide a concentration of deep lying energy levels in the energy diagram of the crystal. In this connection the phrase "deep lying" refers to energy levels in the forbidden gap of the energy diagram of the semiconductor crystal. Typically, such energy levels are removed from the limits of the gap a distance more than twice that of a typical significant impurity. Examples of impurities exhibiting such deep lying energy level characteristics, conveniently termed "deep lying impurity atoms" in silicon are zincs, iron, manganese, indium, gold, sulfur and cobalt.

In a preferred embodiment the invention comprises a semiconductor wafer including a bulk portion of one conductivity type and an epitaxially grown surface portion of the opposite conductivity type defining therebetween a PN junction. A separate ohmic connection is made to each portion of the wafer. A direct current bias voltage source and an alternating current signal source are serially connected between the ohmic connections forming the input circuit. The output characteristic is observed between the two ohmic connections. Additionally, the PN junction device includes a concentration of deep lying impurity atoms in the space charge region of the PN junction. In this connection the space charge region of the PN junction refers to the depletion region associated with the PN junction within the range of reverse bias conditions from zero applied reverse bias (at equilibrium) to a value at which the reverse bias equals the junction breakdown voltage.

At equilibrium only a small number of these impurity atoms are ionized. However, on the application of a sufficiently large reverse bias across the PN junction, all of the impurity atoms are ionized in a finite time which is a measure of the ionization frequently $f_i$ of the particular impurity employed. An impressed signal having a frequency $f>f_i$ enables operation of the device in the partially ionized state resulting in the more sensitive capacitance response.

Accordingly, a feature of this invention is a PN junction device including a concentration of deep lying impurity atoms in the space charge region of the PN junction, a bias voltage poled to reverse bias the PN junction and a signal voltage having a frequency greater than the ionization frequency associated with the deep lying impurity.

The invention and its objects, features and advantages will be understood more clearly from the following detailed description rendered in connection with the drawing in which:

FIG. 4 is a table of the various modes of operation.

The figures are exaggerated in certain dimensions and not necessarily to scale in order to more adequately describe the invention.

Figure 1:
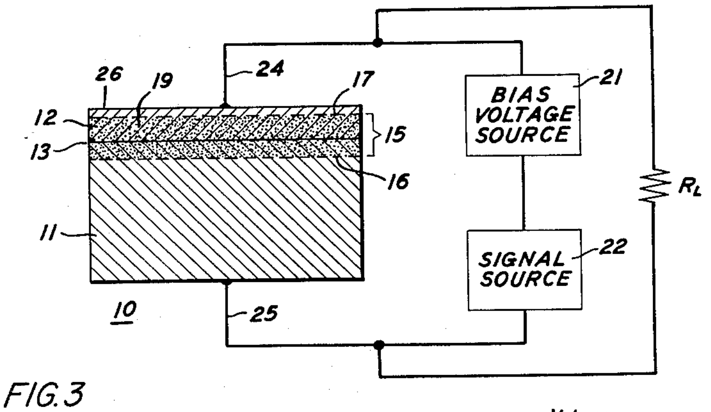
FIG. 1 is an arrangement, partially in cross section, in accordance with this invention.

Referring specifically to FIG. 1, the silicon semiconductor wafer 10 includes a bulk portion 11 typically of low resistivity P-conductivity type and an epitaxial surface portion 12 of N-conductivity type forming a PN junction 13 therebetween. The space charge region 15 is shown under moderate reverse bias conditions bounded by broken line 16 in the bulk region and broken line 17 in the expitaxial surface region. Under reverse bias conditions the penetration of the space charge region in the epitaxial surface portion far exceeds that in the bulk portion because of the relatively higher concentration of significant impurities advantageously included in the bulk portion. Deep lying impurities 19 such as manganese are shown dispersed in the space charge region 15. A direct current bias voltage source 21 typically a five-volt battery and an alternating current signal source 22 having a frequency typically in the kilomegacycle range and a peak-to-peak voltage of about 10 volts are connected serially with the wafer 10 by way of lead 24 connected to the epitaxial surface portion 12 and lead 25 connected to the bulk portion 11. The application of a signal having a frequency in the kilomegacycle range typically requires an arrangement of waveguides as is well known in the art and consequently not shown. The bias voltage from source 21 is poled to reverse bias the PN junction. Under the reverse bias condition the signal voltage from source 22 is applied. The thus provided alternating current capacitance-voltage characteristic observed between leads 24 and 25 of the arrangement of FIG. 1 depends on the frequency $f$ of the signal voltage. Specifically, there are three distinct modes of operation, depending on the following conditions, respectively: Case I, $f<<f_i<f_r$; Case II, $f_i<f<f_r$; and Case III, $f>>f_r>f_i$, where $f_r$ is the frequency corresponding to the time required for the ionized impurity to recombine with a charge carrier in the particular semiconductor material.

Although the $f_i$ and $f_r$ of the various deep lying impurities have not been determined accurately, the following table includes a group of impurities which provides the range of frequencies from which $f$ may be selected, and represents the best available estimates of the values designated. It is to be noted that the recombination frequency $f_r$ is always a factor of between $10^2$ and $10^3$ greater than the ionization frequency $f_i$.

*Table I*

| Deep Lying Impurity | $f_i$ | $f_r$ |
|---|---|---|
| Zinc | 10 megacycles | 1 kilomegacycle. |
| Manganese | 10 kilocycles | 1 megacycle. |
| Indium | 10 kilomegacycles | 1,000 kilomegacycles. |
| Gold | 10 megacycles | 1 kilomegacycle. |
| Sulfur | do | Do. |

The values included in the table are for silicon and at room temperature since both $f_i$ and $f_r$ increase exponentially with increasing absolute temperature.

The operation of the configuration of FIG. 1 can be explained in terms of an analogy between a PN junction semiconductor crystal and an ordinary capacitor. The term "PN junction" refers to the interface between two contiguous regions of semiconductor crystalline material of the opposite conductivity type, the potential difference between the two regions resulting in a "junction barrier" or space charge region about the interface. Accordingly, the PN junction has a finite width characterized by a potential gradient and bounded to either side by the steady state conductivity conditions of each region. Within the junction, then, positive and negative charge carriers are under the influence of a considerable electric field and are removed thereby to opposite boundaries of the junction or space charge region. The resulting physical situation can be described as the separation of opposite charges by a dielectric, the situation being analogous to that of a capacitor in which the boundaries of the space charge region adjoining the PN junction correspond to plates of the capacitor.

The capacitance exhibited by this "capacitor" is inversely proportional to the distance between its "plates." Therefore, as the space charge region contracts or as the distance between plates is decreased, the capacitance is increased. The width of the space charge region or the distance between the "plates" depends, however, on the number of ionized impurity atoms in the space charge region. As the number of ionized impurity atoms is increased, the distance between the plates, for a particular applied voltage, is decreased and accordingly the capacitance is increased.

In this invention, a PN junction semiconductor crystal contains a concentration of deep lying impurity atoms which is not ionized appreciably under conditions of no applied bias. However, when a reverse bias is applied across the PN junction the entire concentration of deep lying impurity atoms is ionized. Thus the density of ionized atoms in the space charge region is increased, leading to a capacitance higher than that obtained without the concentration of the deep lying impurity.

In varactor diode operation, it is advantageous to increase the rate of change in capacitance. Accordingly, a signal voltage is superimposed on the reverse bias. Keeping in mind that it takes a finite time both to ionize a deep lying impurity atom and to recombine the ionized atom with the charge carrier, a frequency can be specified above which the space charge can be expanded and contracted or the distance between the plates of the capacitor can be varied without causing or maintaining an increase in the total concentration of ionized atoms.

For example, under the conditions of a steady reverse bias voltage, the capacitor exhibits a capacitance porporsional to the square root of the concentration of the shallow lying significant impurity atoms plus the concentration of the deep lying impurity atoms. If a signal voltage having a frequency greater than the ionization frequency but less than the recombination frequency of the deep lying impurity (Case II) is superimposed on the steady state voltage, the resulting capacitance decrease, as the signal voltage decreases, is greater than the capacitance decrease exhibited by a prior art varactor diode. The capacitance in the former instance decreases more swiftly because of the recombination of the ionized deep lying impurity atoms with the available charge carriers.

This invention, then, concerns a mechanism for varying the density of ionized atoms in the space charge region of a PN junction, or, analogously, varying the distance between the plates of a capacitor.

Accordingly, the varactor diode arrangement of FIG. 1, operated in the three modes of operation specified above, results in capacitance-voltage characteristics which differ significantly from those exhibited by a varactor diode including only shallow lying impurities.

Figure 2:
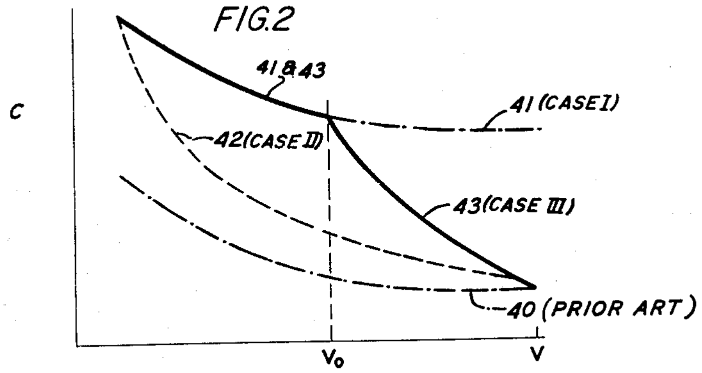
FIG. 2 is a graph illustrating the capacitance-voltage characteristic exhibited by an arrangement in accordance with this invention in its various modes of operation.

Such a comparison is made in FIG. 2. Broken curve 40 represents a typical capacitance-voltage characteristic exhibited by a prior art varactor diode including a concentration of only shallow lying impurities corresponding to broken line 50 of FIG. 3 as described below. Curve 41 is the capacitance-voltage characteristic exhibited by the arrangement of FIG. 1 operated under the conditions of Case I. Curve 41 can be seen displaced from but otherwise the same as curve 40. Under the conditions of Case II the characteristic represented by curve 42 is exhibited. Under the conditions of Case III the characteristic represented by curve 43 is exhibited. The curve 42 has a slope steeper than that of prior art devices but not as steep as the slope of the right hand portion of curve 43 as is explained in detail below.

Figure 3:
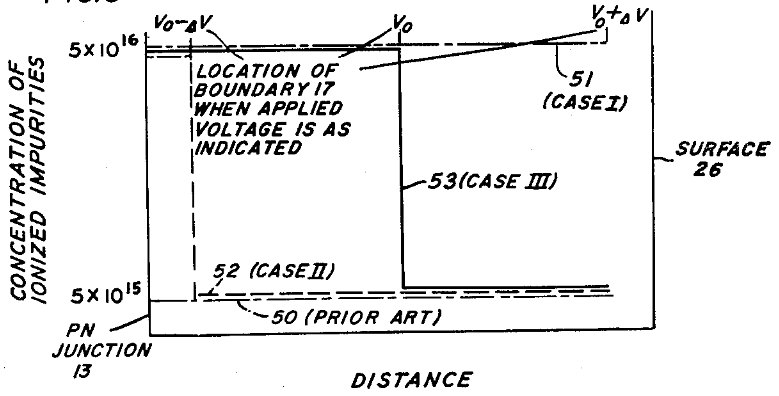
FIG. 3 is a graph illustrating the ionized impurity concentration in the space charge region of the PN junction during the various modes of operation of the arrangements of FIG. 1.

More specifically, the three modes of operation are illustrated in FIG. 3 in terms of impurity concentration versus distance from the PN junction. The graph of FIG. 3 has as its ordinate the number of ionized impurity atoms, particularly in the range from $5\times10^{15}$ to $5\times10^{16}$. The abscissa of the graph is distance in the semiconductor element measured from the PN junction 13 to the surface 26. Denoted by three small vertical marks along the upper edge of the graph are the locations of the boundary 17 of the space charge region under the specific condition of applied voltage as indicated at each mark. Thus these marks indicate the expansion and contraction of the space charge region as the signal voltage swings through its cycle. The level of ionized impurities for both the prior art varactor diode and the varactor diode in accordance with this invention under the various modes of operation is as shown for the several lines 50, 51, 52, and 53. It should be noted that for the varactor diode in accordance with this invention in all three modes of operation the level of ionized impurities is always at the $5\times10^{16}$ value in the portion of the space charge region next to the PN junction 13 which is not affected by the signal voltage, that is, not modulated. Thus the diode in accordance with this invention has a capacitance value when the space charge region is at a minimum which is greater than the prior art diode because of the presence of deep lying impurities.

*Case I, $f<<f_i<f_r$.*—The direct current source 21 provides a reverse bias voltage V expanding the boundary 17 (of FIG. 1) to the position indicated in FIG. 3 by $V_o$ which equals $V+V_b$ where $V_b$ is the built-in voltage. The following concerns the variations in impurity concentration in the space charge region as a signal of frequency $f$ and of amplitude $\Delta V$ is superimposed on $V_o$ which is considered the equilibrium position of the boundary of the space charge region. It is to be noted that under bias conditions both the shallow lying and the deep lying impurity atoms in the space charge region are completely ionized. The voltage swing of the signal produces variations in the completely ionized condition in the correspondingly expanded and contracted space charge region.

Then, as the voltage is increased to $V_o+\Delta V$, the deep lying impurities have ample time to ionize and the impurity concentration in the now enlarged space charge region remains at the fully ionized deep lying impurity concentration level which is typically about $5\times10^{16}$ atoms per cubic centimeter indicated by 51 in the figure. As the space charge boundary moves to the left in response to the swing of the signal voltage, the ionized deep lying impurity atoms recombine outside of the space charge region. However, the ionized deep lying impurity atoms within the now decreasing space charge region remains ionized. Therefore, the ionized impurity level in this portion of the space charge region remains unchanged. The same is true after the boundary reaches the equilibrium position at $V_o$. The signal voltage at this instant starts through the remainder of its cycle which is of a polarity opposite to that of the bias voltage. The boundary, accordingly, moves to the left of the equilibrium position and any deep lying impurity atoms remaining to the right of the boundary recombine. However, the deep lying impurity concentration within the space charge region still remains unchanged. Thus the impurity concentration and consequently the magnitude of the capacitance differ from that of the prior art. However, the change in capacitance for a given change in input voltage remains unchanged. Accordingly, curve 41 of FIG. 2 is displaced from but otherwise exactly the same as curve 40. The displacement is due to the increased concentration of impurities provided by the deep lying impurities.

In this case, then, there is no improvement in the capacitance-voltage response.

*Case II, $f_i<f<f_r$.*—As the boundary of the space charge region moves to the right from its equilibrium position corresponding to $V_o$ to that at $V_o+\Delta V$, the deep lying impurity atoms have insufficient time to ionize and the impurity density in the expanding space charge region is at the ionized shallow lying impurity concentration level. As the boundary moves to the left from $V_o+\Delta V$ to $V_o$, any available ionized deep lying impurity atoms recombine. As the boundary moves to the left of its equilibrium position in response to a change in voltage from $V_o$ to $V_o-\Delta V$, the deep lying impurity atoms ionized at $V_o$ recombine and the concentration remains at the ionized shallow lying impurity concentration level. During further signal voltage swings, the deep lying impurity atoms do not have time to ionize and, effectively, under the conditions of Case II, the concentration of deep lying impurity atoms in the space charge region remains at the ionized, shallow lying impurity concentration level indicated by curve 52 of FIG. 3. The result is the capacitance-voltage characteristic 42 of FIG. 2 having a desirably steeper slope than the characteristic exhibited by the varactor diodes of prior art. The steeper slope, however, is attributed to the contribution of the higher concentration of ionized impurity atoms existing in the space charge region when the boundary is at a position corresponding to $V_o-\Delta V$.

*Case III, $f>>f_r>f_i$.*—As the boundary moves to the right in response to a voltage change from $V_o$ to $V_o+\Delta V$, the deep lying impurity atoms have insufficient time to ionize and the concentration of ionized impurity atoms in the space charge region drops to the ionized, shallow lying impurity concentration level. As the boundary moves to the left of the equilibrium position, corresponding to a voltage change from $V_o$ to $V_o-\Delta V$, the ionized deep lying impurity atoms have insufficient time to recombine and the impurity concentration in the initial space charge region remains at the ionized deep lying impurity concentration level. The concentration versus distance curve in this case is illustrated by stepped line 53 of FIG. 3. The corresponding capacitance-voltage characteristic is illustrated by curve 43 of FIG. 2. Curve 43 can be seen to include a singularity (rounded in practical devices) at $V_o$ which is attributed to the differing concentration of ionized impurity atoms exhibited by curve 53 to either side of $V_o$ in FIG. 3. Here, also, the slope obtained is steeper than is possible in prior art varactor diodes.

Therefore, in order to achieve a steeper capacitance-voltage characteristic in accordance with this invention, it is advantageous to apply a signal having a frequency greater than the ionization frequency of the deep lying impurity included in the semiconductor crystal lattice.

It is possible to obtain certain advantages by applying a signal having a frequency approaching $f_r$ or $f_i$. In such a case, a hysteresis effect is exhibited, the capacitance following, for example, curve 42 as voltage varies in one direction and curve 43 in the other. This phenomenon finds particular use in memory devices.

Shallow lying impurities also have an $f_i$ and $f_r$ associated with them. Accordingly, one might expect that a response as described above in Case II or III might be elicited from a varactor diode including shallow lying impurities only. This is not the case, however, because the cut-off frequency $f_{co}$ exhibited by semiconductor devices including only shallow lying impurities lies considerably below the corresponding $f_i$, at a given temperature at which partial ionization of shallow lying impurity atoms is realizable.

In accordance with this invention, the maximum capacitance is determined by the concentration of the ionized deep lying impurity atoms, the contribution of the shallow lying impurity atoms being negligible. The concentration of ionized shallow lying impurity atoms, however, still determines the minimum capacitance and the series resistance. Accordingly, $f_{co}$ is fixed by the shallow lying impurity concentration and $f_i$ is chosen smaller than $f_{co}$ by selecting a suitable deep lying impurity. In practice, it has been found necessary to employ an epitaxial surface portion in order to achieve suitably low series resistances.

The maximum concentration of deep lying impurity atoms in a semiconductor wafer in accordance with this invention is greater than that of the shallow lying impurity atoms of the same conductivity type. In silicon the concentration of deep lying impurity atoms is limited by its solid solubility. However, in some semiconductor materials the solid solubility of the deep lying impurity exceeds the concentration corresponding to junction breakdown. In this case, the concentration of deep lying impurity atoms corresponding to junction breakdown becomes limiting.

A varactor diode in accordance with this invention is fabricated in the following manner: The starting wafer is a single crystal silicon semiconductor slice about .25 x .25 x .010 inch. The wafer includes a uniform concentration of about $10^{20}$ atoms per cubic centimeter of boron. Accordingly, the wafer exhibits a low resistance P-type conductivity. The wafer then is heated for twenty-four hours at 1300 degrees centigrade in an evacuated (approximately $10^{-5}$ millimeters of mercury) quartz capsule which includes a vapor of manganese to provide a concentration of $4\times10^{16}$ atoms per cubic centimeter of manganese. The wafer then is lapped and polished in a manner well known in the art, to about .005 inch. Next an epitaxial surface portion is grown on the polished surface by the decomposition of silicon tetrachloride as disclosed in copending applicaiton Serial No. 35,152 filed June 10, 1960, for J. J. Kleimack, H. H. Loar and H. C. Theuerer. The epitaxial surface portion is about .00006 inch thick, of N-type conductivity and having a resistivity of one ohm-centimeter. The wafer then is heated for two minutes at 1275 degrees centigrade to activate (fix in position in the crystal lattice) the deep lying impurities. An ohmic connection is made to both the epitaxial surface portion and the bulk portion of the wafer by evaporating a layer of titanium 1000 Angstrom units thick onto the oxide film accumulated naturally on exposed silicon surfaces, coating the titanium layer with a layer of silver 10,000 Angstrom units thick and heating at 200 degrees centigrade for about ten minutes. Such a technique is disclosed in detail in copending application Serial No. 74,872, filed December 9, 1960, for M. P. Lepselter, now Patent 3,106,489, issued October 8, 1963. Subsequently, the wafer is divided into dots .002 inch in diameter.

The finished device is connected, at room temperature, serially to a five-volt bias supply. A signal source having a peak-to-peak voltage of ten volts and a frequency of six kilomegacycles is superimposed by well known techniques on the bias voltage supply. The capacitance is observed to change from two picofarads to 0.13 picofarad.

No effort has been made to describe all possible embodiments of the invention. It should be understood that the embodiment described is merely illustrative of the preferred form of the invention and various modifications may be made therein without departing from the spirit and scope of this invention.

For example, although the invention is disclosed in terms of silicon semiconductor material, it is not to be construed as limited thereby because any semiconductor material suitable for fabricating varactor diodes is adaptable in accordance with this invention.

What is claimed is:

1. In combination, a semiconductor device comprising at least one PN junction and an associated space charge region, substantially all of said space charge region including a concentration of a deep lying impurity, said deep lying impurity having an associated ionization frequency, supply means for reverse biasing said PN junction, and signal means for varying the reverse bias at a frequency greater than said ionization frequency.

2. In combination, a semiconductor device comprising at least one PN junction and an associated space charge region, substantially all of said space charge region including a deep lying impurity selected from a group consisting of iron, manganese, sulfur, indium, cobalt, gold and zinc, said deep lying impurity having an associated ionization frequency, supply means for reverse biasing said PN junction, and signal means for varying the reverse bias at a frequency greater than said ionization frequency.

3. In combination, a semiconductor device comprising at least one PN junction and an associated space charge region, substantially all of said space charge region including a concentration of a deep lying impurity selected from a group consisting of iron, manganese, sulfur, indium, cobalt, gold and zinc, said deep lying impurity having an associated ionization frequency, supply means for reverse biasing said PN junction, and signal means for varying the reverse bias at a frequency of about said ionization frequency.

4. In combination, a semiconductor device comprising at least one PN junction and an associated space charge region, substantially all of said space charge region including a concentration of a deep lying impurity selected from a group consisting of iron, manganese, sulfur, indium, cobalt, gold and zinc, said deep lying impurity having an associated recombination frequency, supply means for reverse biasing said PN junction, and signal means for varying the reverse bias at a frequency of about said recombination frequency.

5. In combinaiton, a semiconductor wafer comprising a bulk portion and an epitaxial surface portion, said bulk portion including a shallow lying impurity of one conductivity type, said epitaxial surface portion including a shallow lying impurity of the opposite conductivity type for forming therebetween a PN junction, said junction having associated therewith a space charge region, substantially all of said space charge region including a concentration of a deep lying impurity, the concentration of said deep lying impurities exceeding the concentration of shallow lying impurities in said epitaxial surface portion, substantially ohmic contacts to said bulk portion and said epitaxial surface portion, supply means connected between the substantially ohmic contacts for reverse biasing said PN junction, and signal means superimposed on said supply means for varying the reverse bias at a frequency greater than said ionization frequency.

6. In combination, a silicon semiconductor wafer comprising a bulk portion and an epitaxial surface portion, said bulk portion including a shallow lying impurity of one conductivity type, said epitaxial surface portion including a shallow lying impurity of the opposite conductivity type for forming therebetween a PN junction, said junction having associated therewith a space charge region substantially within said epitaxial surface portion, substantially all of said space charge region including a concentration of a deep lying impurity selected from a group consisting of zinc, iron, manganese, indium, gold, sulfur and cobalt, the concentration of said deep lying impurities exceeding the concentration of shallow lying impurities in said epitaxial surface portion, substantially ohmic contacts to said bulk portion and said epitaxial surface portion, supply means connected between the substantially ohmic contacts for reverse biasing said PN junction, and signal means superimposed on said supply means for varying the reverse bias at a frequency greater than said ionization frequency.

7. In combination, a silicon semiconductor wafer comprising a bulk portion and an epitaxial surface portion, said bulk portion including a concentration of about $10^{20}$ atoms per cubic centimeter of boron, said epitaxial surface portion including a concentration of less than $4 \times 10^{16}$ atoms per cubic centimeter of manganese and being of N-conductivity type for forming therebetween a PN junction, said junction having associated therewith a space charge region substantially within said epitaxial surface portion, a separate low resistance connection to said bulk portion and said epitaxial surface portion, supply means connected between said low resistance connections for reverse biasing said PN junction, and signal means superimposed on said supply means for varying the reverse bias at a frequency greater than the ionization frequency of manganese.

References Cited by the Examiner

UNITED STATES PATENTS

| | | | |
|---|---|---|---|
| 2,964,637 | 12/60 | Keiyer | 307—88.5 X |
| 2,989,671 | 6/61 | Barnes | 317—235 |
| 2,992,471 | 7/61 | Riesz | 307—88.5 |
| 2,993,155 | 7/61 | Götzberger | 317—235 |

OTHER REFERENCES

Bakanowski et al.: "Difused Silicon Nonlinear Capacitors," IRE Transactions on Electronic Devices, vol. ED-6, No. 4, October 1959, pages 384–90.

McMahon et al.: "Voltage-Variable Capacitors—State of the Art," Electronic Industries, December 1959, pages 90 to 94.

American Physical Society Bulletin Ser. 2, vol. 4, 1959, pages 409, 410–62, by Goetzberger and Shockley.

ARTUR GAUSS, *Primary Examiner.*

HERMAN K. SAALBACH, *Examiner.*